(12) United States Patent
Chiang et al.

(10) Patent No.: US 11,145,676 B1
(45) Date of Patent: Oct. 12, 2021

(54) MEMORY DEVICE AND MULTI-LEVEL MEMORY CELL HAVING FERROELECTRIC STORAGE ELEMENT AND MAGNETO-RESISTIVE STORAGE ELEMENT

(71) Applicant: Taiwan Semiconductor Manufacturing Co., Ltd., Hsinchu (TW)

(72) Inventors: Hung-Li Chiang, Taipei (TW); Chao-Ching Cheng, Hsinchu (TW); Chih-Sheng Chang, Hsinchu (TW); Tzu-Chiang Chen, Hsinchu (TW); Jin Cai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/880,998

(22) Filed: May 22, 2020

(51) Int. Cl.
*G11C 11/22* (2006.01)
*H01L 27/11597* (2017.01)
*H01L 43/08* (2006.01)
*G11C 11/16* (2006.01)

(52) U.S. Cl.
CPC .... *H01L 27/11597* (2013.01); *G11C 11/1655* (2013.01); *G11C 11/1657* (2013.01); *G11C 11/1673* (2013.01); *G11C 11/1675* (2013.01); *G11C 11/2255* (2013.01); *G11C 11/2257* (2013.01); *G11C 11/2273* (2013.01); *G11C 11/2275* (2013.01); *H01L 43/08* (2013.01)

(58) Field of Classification Search
CPC ............ H01L 27/11597; H01L 43/08; G11C 11/2255; G11C 11/1657; G11C 11/1673; G11C 11/1655; G11C 11/2273; G11C 11/1675; G11C 11/2275; G11C 11/2257
USPC .................................................. 365/145, 158
See application file for complete search history.

(56) References Cited

U.S. PATENT DOCUMENTS

| | | | |
|---|---|---|---|
| 6,714,442 B1* | 3/2004 | Nahas ..................... | G11C 11/16 365/158 |
| 7,272,035 B1* | 9/2007 | Chen ....................... | G11C 11/16 365/158 |
| 9,715,916 B1* | 7/2017 | Tomishima .......... | G11C 11/1675 |
| 9,734,882 B2* | 8/2017 | Toh ....................... | G11C 11/161 |
| 9,792,994 B1* | 10/2017 | Modi ............... | H03K 19/00315 |
| 10,483,457 B1* | 11/2019 | Lee ....................... | G11C 11/1673 |
| 2002/0057593 A1* | 5/2002 | Hidaka ............... | G11C 11/1675 365/171 |
| 2003/0026125 A1* | 2/2003 | Hidaka ............... | G11C 11/1655 365/158 |
| 2006/0067114 A1* | 3/2006 | Hachino ................ | G11C 13/02 365/158 |

(Continued)

*Primary Examiner* — Michael T Tran
(74) *Attorney, Agent, or Firm* — JCIPRNET

(57) ABSTRACT

A memory device includes a plurality of word lines, a plurality of bit lines, a plurality of source lines and a plurality of multi-level memory cells is introduced. Each of the multi-level memory cells is coupled to one of the word lines, one of the bit lines and one of the source lines. Each of the multi-level memory cells includes a ferroelectric storage element and a magneto-resistive storage element cascaded to the ferroelectric storage element. The ferroelectric storage element is configured to store a first bit of a multi-bit data. The magneto-resistive storage element is configured to store a second bit of the multi-bit data.

18 Claims, 5 Drawing Sheets

(56) References Cited

U.S. PATENT DOCUMENTS

| | | | | |
|---|---|---|---|---|
| 2007/0211523 A1* | 9/2007 | Kim | H01L 27/226 | 365/158 |
| 2007/0297223 A1* | 12/2007 | Chen | G11C 11/16 | 365/173 |
| 2008/0002481 A1* | 1/2008 | Gogl | G11C 5/04 | 365/189.06 |
| 2009/0175108 A1* | 7/2009 | Dittrich | G11C 7/14 | 365/210.1 |
| 2009/0244965 A1* | 10/2009 | Reohr | G11C 11/1659 | 365/173 |
| 2010/0059837 A1* | 3/2010 | Kim | H01L 27/228 | 257/421 |
| 2012/0008369 A1* | 1/2012 | Shimuta | G11C 13/0009 | 365/148 |
| 2012/0099358 A1* | 4/2012 | Sunaga | G11C 11/1657 | 365/66 |
| 2014/0177318 A1* | 6/2014 | Ting | G11C 14/00 | 365/148 |
| 2016/0196870 A1* | 7/2016 | Miyano | G11C 11/419 | 365/72 |
| 2016/0225429 A1* | 8/2016 | Toh | G11C 11/1675 | |
| 2016/0225819 A1* | 8/2016 | Toh | H01L 27/228 | |
| 2017/0077177 A1* | 3/2017 | Shimomura | G11C 11/1675 | |
| 2017/0270985 A1* | 9/2017 | Shimomura | G11C 11/161 | |
| 2018/0061467 A1* | 3/2018 | Kan | G11C 11/1675 | |
| 2018/0301178 A1* | 10/2018 | Kim | G11C 11/1697 | |
| 2019/0172999 A1* | 6/2019 | Chia | H01L 27/228 | |
| 2019/0198754 A1* | 6/2019 | Lin | H01L 43/10 | |
| 2019/0325933 A1* | 10/2019 | Lee | G11C 13/003 | |
| 2019/0342199 A1* | 11/2019 | Hurson | H04L 47/193 | |
| 2019/0354653 A1* | 11/2019 | Weng | G06F 30/39 | |
| 2019/0362765 A1* | 11/2019 | Park | G11C 8/08 | |
| 2020/0005844 A1* | 1/2020 | Alhalabi | G11C 11/1675 | |
| 2020/0126873 A1* | 4/2020 | Noh | H01L 43/12 | |
| 2020/0265887 A1* | 8/2020 | Atsumi | H01L 27/1156 | |
| 2020/0321394 A1* | 10/2020 | Hashemi | H01L 27/224 | |
| 2020/0411065 A1* | 12/2020 | Choi | G11C 11/2297 | |
| 2021/0074762 A1* | 3/2021 | Tsubata | G11C 11/161 | |
| 2021/0083171 A1* | 3/2021 | Bak | H01L 43/08 | |
| 2021/0111337 A1* | 4/2021 | Huo | H01L 43/10 | |
| 2021/0167279 A1* | 6/2021 | Murakami | H01L 43/08 | |
| 2021/0175253 A1* | 6/2021 | Han | H01L 27/11587 | |
| 2021/0175412 A1* | 6/2021 | Chern | H01L 27/226 | |

* cited by examiner

US 11,145,676 B1

MEMORY DEVICE AND MULTI-LEVEL MEMORY CELL HAVING FERROELECTRIC STORAGE ELEMENT AND MAGNETO-RESISTIVE STORAGE ELEMENT

BACKGROUND

An array of memory cells is used in many electronic devices for storing data. A memory array could be a single-level memory array that stores one bit per cell or a multi-level memory array that stores multiple bits per cell. As a multi-level memory cell in the multi-level memory array may store multiple bits per cells, the multi-level memory array has higher storage density than the single-level memory array. However, the structure of the multi-level memory array may be more complicated than the single-level memory array, and the footprint area of the multi-level memory cell is bigger than a single-level memory cell on a semiconductor die or circuit.

Under pressure for miniaturization of electronic devices, a high storage density memory cell device without area penalty is expected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
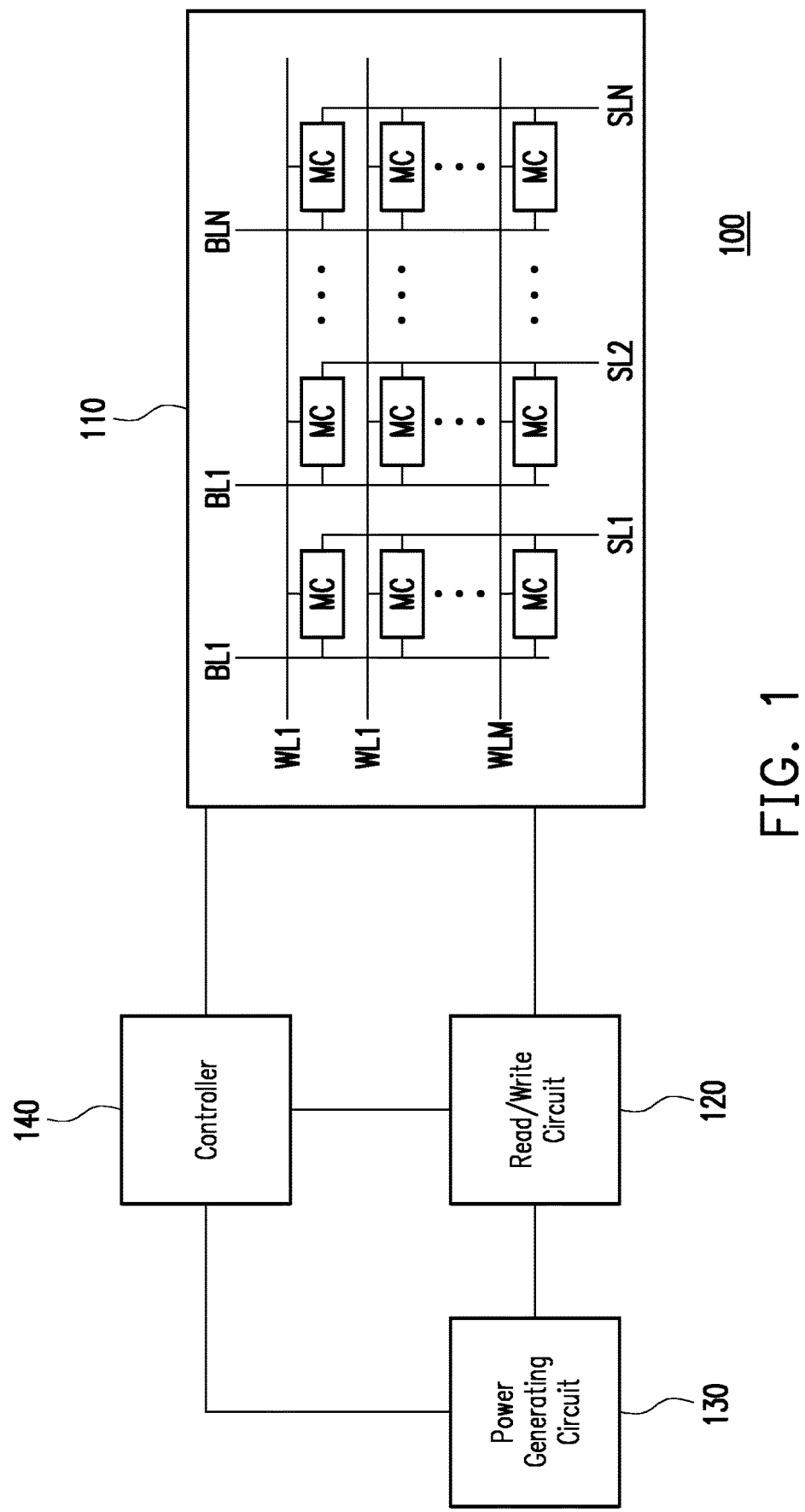
FIG. 1 is a schematic diagram illustrating a memory device in accordance with some embodiments.

The following disclosure pi oxides many different embodiments, or examples, for implementing different features of the present disclosure. Specific examples of components and arrangements are described below to simplify the present disclosure. These are, of course, merely examples and are not intended to be limiting. For example, the formation of a first feature over r on a second feature the description that follows gray include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a memory device 100 that includes a memory array 110, a read/write circuit 120, a power generating circuit 130 and a controller 140 in accordance with some embodiments. The memory array 110 may include a plurality of multi-level memory cells MC that are arranged in rows and columns. The memory array 110 may further includes a plurality of word lines WL1 through WLM, a plurality of bit lines BL1 through BLN and a plurality of source lines SL1 through SLN, in which M and N are positive integers. The values of M and N determines the size of the memory array 110. Each of the multi-level memory cells MC may be coupled to one word line among the word lines WL1 through WLM, one bit line among the bit lines BL1 through BLN and one source line among the source lines SL1 through SLN. Memory operations (e.g., a read operation, a write operation or an erase operation) are performed to a selected multi-level memory cells MC through a selected bit line, a selected word line and a selected source line that are coupled to the selected multi-level memory cell MC.

The read/write circuit 120 is coupled to the memory array 110, and is configured to perform a memory operation to the multi-level memory cells MC via the word lines WL1 through WLM, the bit lines BL1 through BLN and the source lines SL1 through SLN. To perform the memory operation to the selected multi-level memory cell MC, the read/write circuit 120 may apply appropriate voltages to the selected word line, the selected bit line and the selected source line that are coupled to the selected multi-level memory cell MC. For example, to read data stored in a selected multi-level memory cell MC, the read/write circuit 120 may apply a read voltage to the selected bit line. In another example, to write data to the a selected multi-level memory cell MC, the read/write circuit 120 may apply a write voltage applied to the bit line of the selected multi-level memory cell MC. In some embodiments, the memory device 100 may further include a decoding circuit (not shown) that is configured to select multi-level memory cells MC for memory operations.

The power generating circuit 130 is configured to generate voltages and/or currents for operating the memory device 100. In some embodiments, the power generating circuit 130 is coupled to the read/write circuit 120 and is configured to generate voltages for memory operations that are performed by the read/write circuit 120. For example, the power generating circuit 130 may generate and provide the read voltage for the read operation performed by the read/write circuit 120. In another example, the power generating circuit 130 may generate and provide the write voltage for the write operation performed by the read/write circuit 120. The power generating circuit 130 may generate and provide power for other components of the memory device 100.

The controller 140 may include logic circuits that are configured to control operations of the memory device 100. The controller 140 may be coupled to the power generating circuit 130 to control the power generation of the power generating circuit 130. The controller 140 may be coupled to the read/write circuit 120 to control the read/write circuit 120 when performing memory operations to the multi-level memory cells MC of the memory array 110.

Figure 2A:
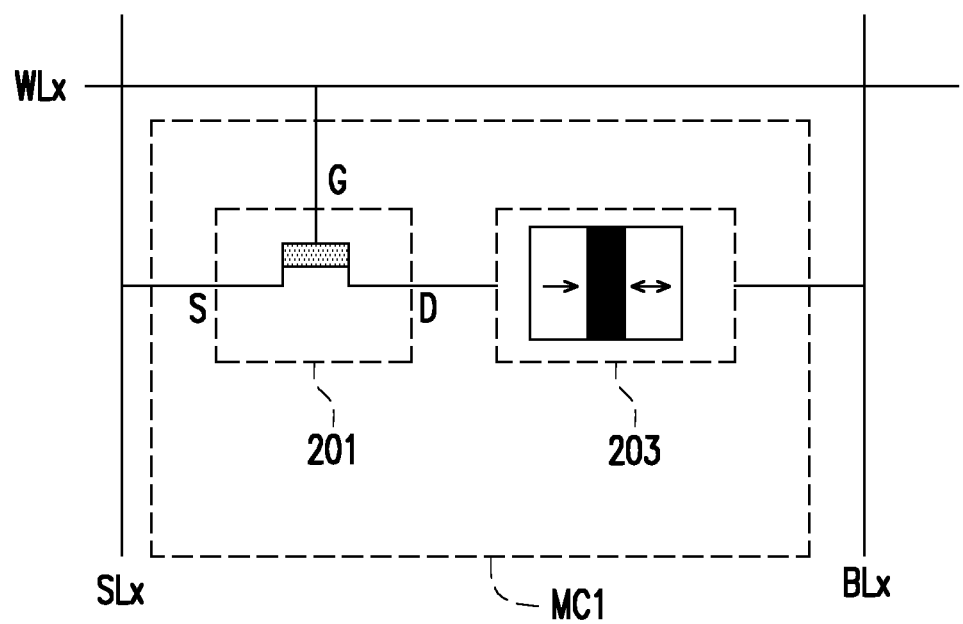
FIG. 2A and FIG. 2C are schematic diagrams illustrating multi-level memory cells in accordance with some embodiments.

FIG. 2A illustrates a schematic diagram of a multi-level memory cell MC1 in accordance with some embodiments. The multi-level memory cell MC 1 is coupled to a word line $WL_x$, a bit line $BL_x$ and a source line $SL_x$, and a memory operation (e.g., a read operation, a write operation, an erase operation) is performed to the multi-level memory cell MC1 through the word line $WL_x$, the bit line $BL_x$ and the source line $SL_x$. The multi-level memory cell MC1 shown in FIG. 2A may be any one of the multi-level memory cells MC of the memory array 110 shown in FIG. 1.

In some embodiments, the multi-level memory cell MC1 includes a ferroelectric storage element 201 and a magneto-resistive storage element 203 that is cascaded to the ferroelectric storage element 201. The multi-level memory cell MC1 is configured to store a multi-bit data that includes a first bit and a second bit. The ferroelectric storage element 201 is configured to store the first bit of the multi-bit data, and the ferroelectric storage element 201 is configured to store the second bit of the multi-bit data.

In some embodiments, the ferroelectric storage element 201 is configured to store the first bit of the multi-bit data based on presence of lack of electrical charges in the ferroelectric storage element 201. For example, when the ferroelectric storage element 201 holds electrical charges, the first bit of the multi-bit data stored in the ferroelectric storage element 201 is in logic state of "1". When the ferroelectric storage element 201 is in lack of the electrical charges, the first bit of the multi-bit data stored in the ferroelectric storage element 201 is in logic state of "0". As such, the stored logic state may be read by measuring a threshold voltage of the ferroelectric storage element 201. In addition, the threshold voltage of the ferroelectric storage element 201 may be changed by injecting the electrical charges to the ferroelectric storage element 201 or removing electrical charges from ferroelectric storage element 201. In some embodiments, the ferroelectric storage element 201 has a nonlinear relationship between the applied electric field and the stored electrical charges. As such, the electrical charges stored in the ferroelectric storage element 201 may be changed by applying appropriate voltages to the word line $WL_x$, the bit line $BL_x$ and the source line $SL_x$ to change the electrical field applied to the ferroelectric storage element 201.

In some embodiments, the magneto-resistive storage element 203 is configured to store the second bit of the multi-bit data based on an electrical resistance of the magneto-resistive storage element 203. The magneto-resistive storage element 203 may have a low resistance state Rp which indicates the logic state of "1" and a high resistance state Rap that indicates the logic state of "0". As such, the stored logic state of the magneto-resistive storage element 203 may be read by measuring the electrical resistance of the magneto-resistive storage element 203. In addition, the stored logic state of the magneto-resistive storage element 203 may be changed by applying an appropriate current flowing through the magneto-resistive storage element 203. For example, appropriate voltages are applied to the word line $WL_x$, the bit line $BL_x$ and the source line $SL_x$ to generate the appropriate current flowing through the magneto-resistive storage element 203.

In some embodiments, the ferroelectric storage element 201 includes a ferroelectric field-effect transistor (FeFET) that has a gate terminal G, a drain terminal D and a source terminal S. The gate terminal G of the FeFET is coupled to the word line $WL_x$; the source terminal S of the FeFET is coupled to the source line $SL_x$; and the drain terminal D of the FeFET is coupled the bit line $BL_x$ through the magneto-resistive storage element 203.

Figure 2B:
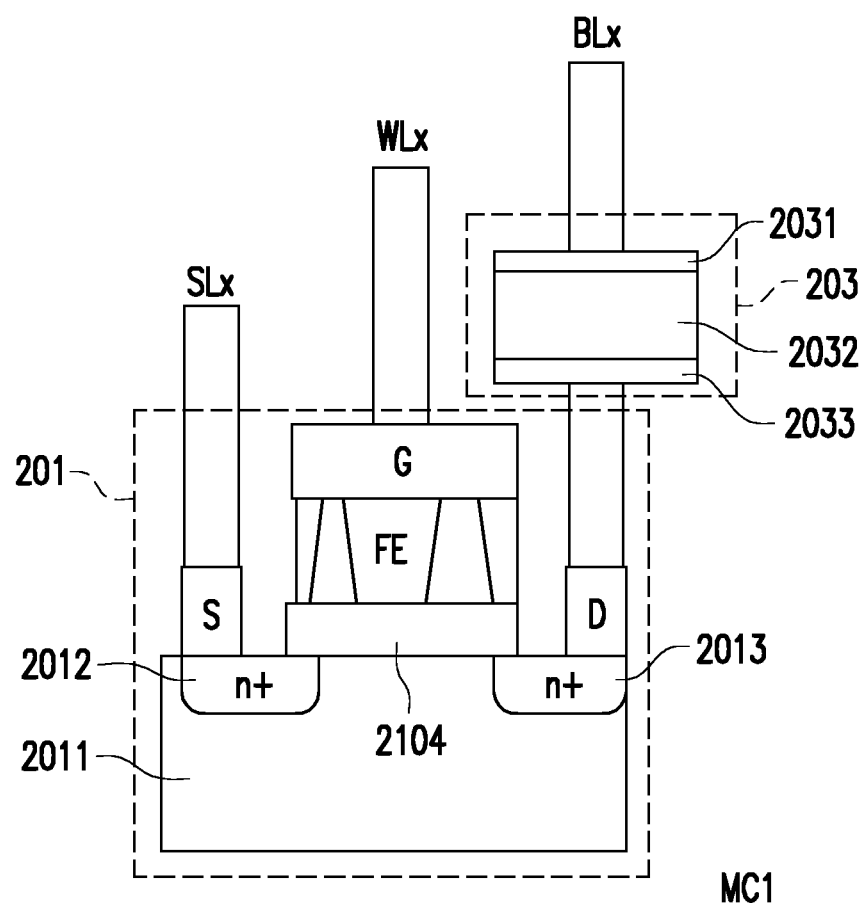
FIG. 2B is a cross-sectional view of a multi-level memory cell in accordance with some embodiments.

FIG. 2B illustrates a cross-sectional view of a multi-level memory cell MC1 shown in FIG. 2A in accordance with some embodiments. The memory cell MC1 includes the ferroelectric storage element 201 and the magneto-resistive storage element 203 that are formed on a substrate 2011. The substrate 2011 includes doped regions 2012 and 2013 that are n-type doped regions. It is noted that the semiconductor types of the substrate 2011 and the doped regions 2012 and 2013 may vary based on designed needs. The doped regions 2012 and 2013 are coupled to the source terminal S and the drain terminal D of the ferroelectric storage element 201, respectively. In some embodiments, a ferroelectric layer FE is formed between the gate terminal G of the ferroelectric storage element 201 and that a channel region that is located between the between the doped regions 2012 and 2013. The channel region is located in the substrate 2011 between the doped regions 2012 and 2013. In some embodiments, the channel region includes a source-drain conduction channel that is formed between the doped regions 2012 and 2013. The ferroelectric layer FE is formed by a ferroelectric material that is not limited to any particular material in this disclosure.

In some embodiments, the magneto-resistive storage element 203 may has a magnetic tunnel junction (MTJ) structure that includes a magnetic layer 2031, a reference magnetic layer 2033 and a tunnel barrier 2032 that is sandwiched between the magnetic layer 2031 and the reference magnetic layer 2033. The reference magnetic layer 2033 has a fixed magnet with fixed polarization direction. The magnetic layer 2031 has free magnet with variable polarization direction. The polarization direction of the magnetic layer 2031 may according to a current flowing through the magnetic layer 2031. In some embodiments, the electrical resistance of the magneto-resistive storage element 203 changes according to an alignment of the fixed polarization direction of the reference magnetic layer 2033 and the variable polarization direction of the magnetic layer 2031. For example, when the fixed polarization direction of the reference magnetic layer 2033 is aligned with the variable polarization direction of the magnetic layer 2031, the electrical resistance of the magneto-resistive storage element 203 is low (e.g., low resistance state). When the fixed polarization direction of the reference magnetic layer 2033 is not aligned with the variable polarization direction of the magnetic layer 2031, the electrical resistance of the magneto-resistive storage element 203 is high (e.g., high resistance state). The magneto-resistive storage element 203 may be coupled to the bit line $BL_x$ of the multi-level memory cell MC1.

Figure 2C:
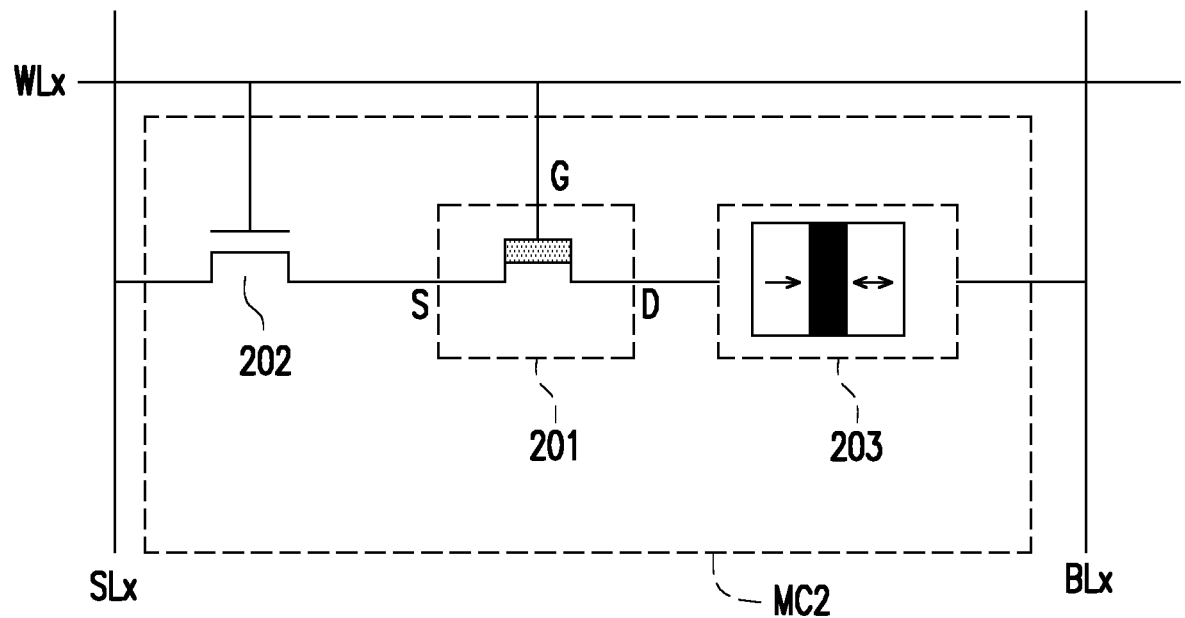

FIG. 2C illustrates a schematic diagram of a multi-level memory cell MC2 in accordance with some embodiments. The same elements of the multi-level memory cell MC2 shown in FIG. 2C and the multi-level memory cell MC1 shown in FIG. 2A are illustrated by same reference numbers. A difference between the multi-level memory cell MC2 shown in FIG. 2C and the multi-level memory cell MC1 shown in FIG. 2A is that the multi-level memory cell MC2 further include an access transistor 202. The access transistor 202 is configured to prevent a disturbance from a memory operation (e.g., write operation) of other multi-level memory cells, especially the multi-level memory cells that are coupled to the same bit line $BL_x$ and the source line $SL_x$. In some embodiments, the access transistor 202 is coupled between the ferroelectric storage element 201 and the source line $SL_x$, in which the gate terminal of the access transistor 202 is coupled to the word line $WL_x$. In some embodiments, when the multi-level memory cell MC2 is selected for a memory operation, the access transistor 202 is turned on to conduct the source line $SL_x$ to the ferroelectric storage element 201, thereby allowing a normal memory operation to be performed to the multi-level memory cell MC2. When the multi-level memory cell MC2 is unselected memory cell for a memory operation, the access transistor is turned off to insulate the multi-level memory cell MC2 from the source line $SL_x$. Accordingly, the disturbance from memory operations on the other multi-level memory cells is prevented. In FIG. 2C, the access transistor 202 is coupled between the ferroelectric storage element 201, but the disclosure is not limited thereto. The access transistor 202 may be coupled between the bit line $BL_x$ and the magneto-resistive storage element 203 in some alternative embodiments.

In some embodiments, the multi-level memory cell MC1 is formed in a semiconductor fabrication. The ferroelectric storage element 201 may be formed in a front-end-of-line (FEOL) processing of the semiconductor fabrication; and the magneto-resistive storage element 203 may be formed in a back-end-of-line (BEOL) processing of the semiconductor fabrication. The FEOL processing may pattern electronic devices (e.g., transistor, capacitor, resistors) on a semiconductor die, and the BEOL processing may interconnect the electronic devices with metallization layer and form electrical connections among the electronic devices. In this way, the fabrication of the ferroelectric storage element 201 and the magneto-resistive storage element 203 of the multi-level memory cell MC1 is simple with low manufacturing cost.

In some embodiments, the ferroelectric storage element 201 may store two logic states (e.g., "1" and "0") based on threshold voltages of the ferroelectric storage element 201 and the magneto-resistive storage element 203 may store two logic states (e.g., "1" and "0") based on the electrical resistance of the magneto-resistive storage element 203. In this way, an integration of the ferroelectric storage element 201 and magneto-resistive storage element 203 may form a multi-level memory cell with four logic states (e.g., "11", "10", "01" and "00"). Accordingly, the integration of the ferroelectric storage element 201 and magneto-resistive storage element 203 may increase the storage density of the multi-level memory cell. In some embodiments, the footprint area of the ferroelectric storage element 201 on a semiconductor die or in a circuit is substantially same as the footprint area of the magneto-resistive storage element 203. As such, the integration of the ferroelectric storage element 201 and the magneto-resistive storage element 203 may form a multi-level memory cell with high storage density without area penalty.

Figure 3A:
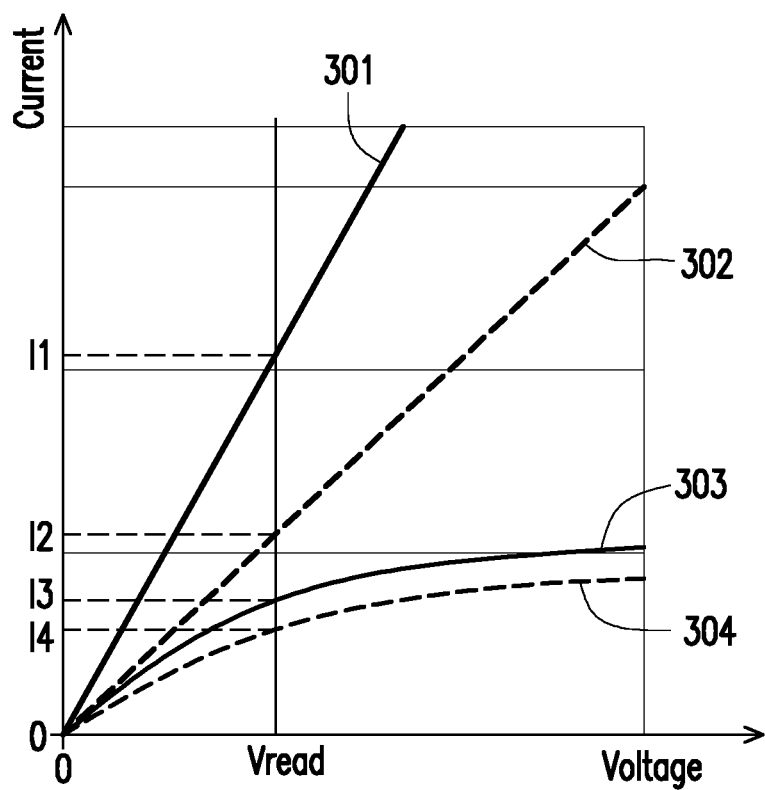
FIGS. 3A through 3C are diagram illustrating current-voltage (IV) curves of logic states of a multi-level memory cell in accordance with some embodiments.
Figure 3B:
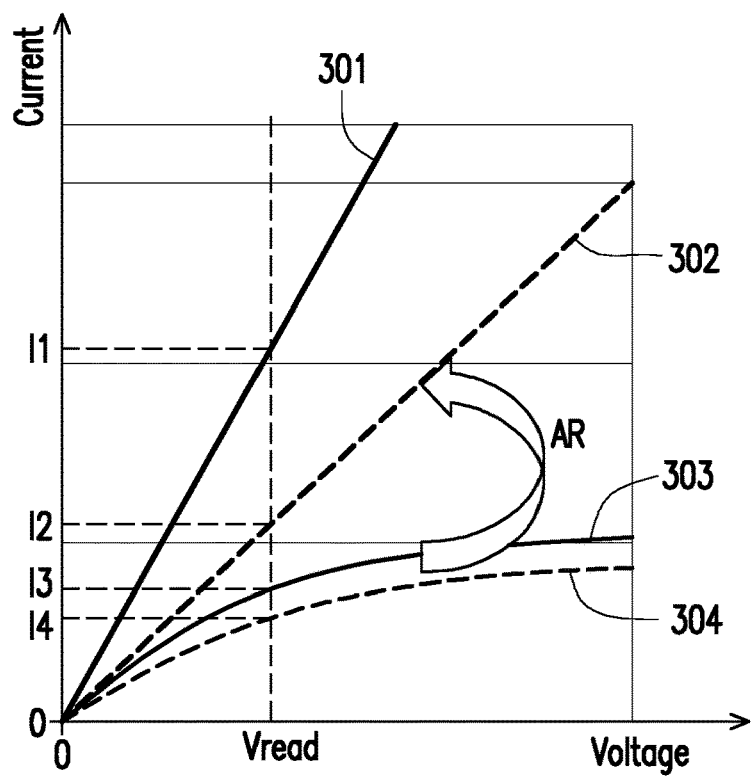
Figure 3C:
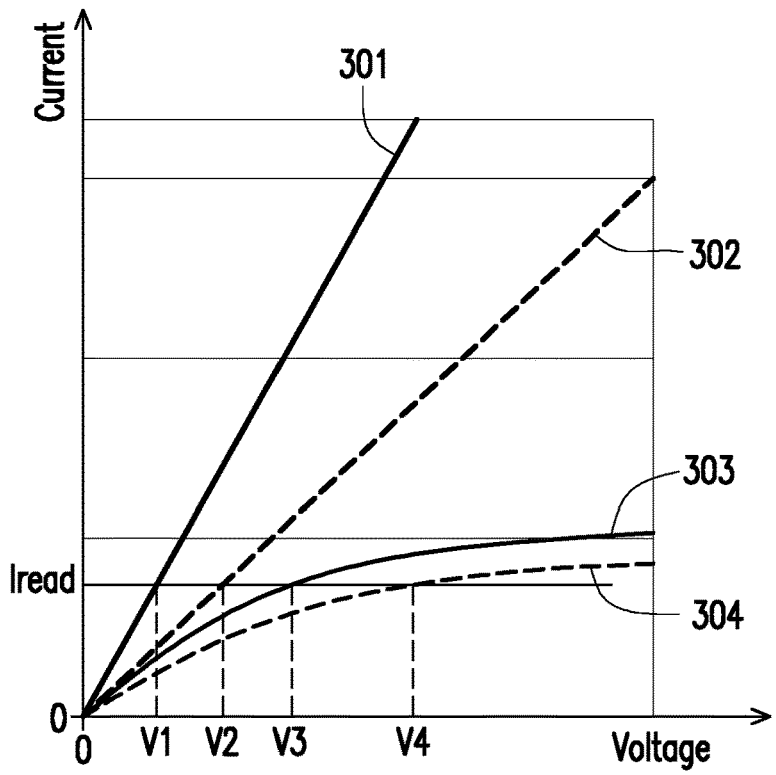

FIGS. 3A through 3C illustrate a current-voltage (IV) curves 301, 302, 303 and 304 corresponding to four logic states of a multi-level memory cell in accordance with some embodiments. The IV curve 301 may correspond to a logic state of "11", in which the ferroelectric storage element 201 has a low threshold voltage and the magneto-resistive storage element 203 has a low resistance. The IV curve 302 may correspond to a logic state of "10", in which the ferroelectric storage element 201 has the low threshold voltage and the magneto-resistive storage element 203 has a high resistance. The IV curve 303 may correspond to a logic state of "01", in which the ferroelectric storage element 201 has a high threshold voltage and the magneto-resistive storage element 203 has the low resistance. The IV curve 304 may correspond to a logic state of "00", in which the ferroelectric storage element 201 has a high threshold voltage and the magneto-resistive storage element 203 has the high resistance.

Referring to FIG. 3A, a read voltage Vread may be used in a read operation of the memory device (e.g., memory device 100) to read the logic state stored in a selected multi-level memory cell of the memory device. Referring to FIG. 1 and FIG. 3A, the read/write circuit 120 may apply the read voltage Vread to the selected multi-level memory cell, and sense current flowing through the bit line coupled to the selected multi-level memory cell. The level of the current sensed from the bit line may be used to determine the logic state stored in the selected multi-level memory cell. As shown in FIG. 3A, when the read voltage Vread is applied to the selected multi-level memory cell, a current I1 is sensed when the stored logic state of the selected multi-level memory cell is "11". Similarly, currents I2, I3 and I4 are sensed when the stored logic state of the selected multi-level memory cell is "10", "01" and "00", respectively. As such, the stored logic state of the selected multi-level memory cells may be determined by applying the read voltage and sensing the current. In some embodiments, the sensing current from the multi-level memory cells may be compare with at least one threshold value to determine the logic state stored in the multi-level memory cells.

Table 1 illustrates voltages applied to word lines, bit lines an sources lines of selected multi-level memory cells and unselected multi-level memory cells in different memory operations accordance with some embodiments. Referring to Table 1, to perform a read operation to a selected multi-level memory cell, the selected word line and the selected bit line coupled to the selected multi-level memory cell are biased by the voltage Vread. The selected source line coupled to the selected multi-level memory cell are biased by a reference voltage (e.g., 0V). Meanwhile, the unselected word lines are biased by the reference voltage (e.g., 0V), and the unselected bit lines and unselected source lines are biased by a reference voltage (e.g., 0V or Vread/2). In this way, the logic state stored in the selected multi-level memory cell is sensed.

TABLE 1

| Memory operation | Sel. WL | Sel. SL | Sel. BL | Unsel. WL | Unsel. SL | Unsel. BL |
| --- | --- | --- | --- | --- | --- | --- |
| Read | Vread | 0 | Vread | 0 | 0 (or Vread/2) | 0 (or Vread/2) |
| Write FeFET 1 | Vwr_FE | 0 | 0 | Vwr_FE/2 | Vwr_FE/2 | Vwr_FE/2 |
| Write FeFET 0 | −Vwr_FE | 0 | 0 | −Vwr_FE/2 | −Vwr_FE/2 | −Vwr_FE/2 |

TABLE 1-continued

| Memory operation | Sel. WL | Sel. SL | Sel. BL | Unsel. WL | Unsel. SL | Unsel. BL |
|---|---|---|---|---|---|---|
| Write MRAM 1 | Von_FE | 0 | Vwr_MRAM | 0 | 0 | 0 |
| Write MRAM 0 | Von_FE | 0 | −Vwr_MRAM | 0 | 0 | 0 |

In some embodiments, to write a multi-bit data having a first bit data and a second bit data to the selected multi-level memory cell, the memory device (e.g., memory device 100) may write the first bit data to the ferroelectric storage element 201 and write the second bit data to the magneto-resistive storage element 203 of the selected multi-level memory cell. In some embodiments, the first bit data of the multi-bit data is written to the ferroelectric storage element 201 of the selected multi-level memory cell based on a voltage difference between the selected word line and the selected bit line. As shown in Table 3, to write bit data of "1" to the ferroelectric storage element 201 of the selected multi-level memory cell, a write voltage Vwr_FE is applied to the selected word line while the reference voltage (e.g., 0V) is applied to the selected bit line and the selected source line. To write bit data of "0" to the ferroelectric storage element 201 of the selected multi-level memory cell, a write voltage -Vwr_FE is applied to the selected word line while the reference voltage (e.g., 0V) is applied to the selected bit line and the selected source line. Since the selected bit line and the selected source line are biased by the same voltage (e.g., 0V) in the writing data to the ferroelectric storage element 201, no current is flowing through the selected bit line and the selected source line. As a result, the writing of the ferroelectric storage element 201 does not disturb the data stored in the magneto-resistive storage element 203.

In some embodiments, the unselected words lines, unselected bit lines and unselected word lines are biased by the voltage of Vwr_FE/2 when the bit data of "1" is written to the ferroelectric storage element 201 of the selected multi-level memory cell. The unselected words lines, unselected bit lines and unselected word lines are biased by the voltage of -Vwr_FE/2 when the bit data of "0" is written to the ferroelectric storage element 201 of the selected multi-level memory cell. As such, no voltage difference is formed between unselected word lines and unselected bit lines of the unselected multi-level memory cells. Thus, the writing on the ferroelectric storage element 201 of the selected multi-level memory cell does not disturb the data stored in the unselected multi-level memory cells.

In some embodiments, the second bit data of the multi-bit data is written to the magneto-resistive storage element 203 of the selected multi-level memory cell based on a current flowing through the selected bit line and the selected source line. As shown in Table 3, to write bit data of "1" to the magneto-resistive storage element 203, an enable voltage Von_FE is applied to the selected word line to enable the magneto-resistive storage element 203 for the write operation. Meanwhile, a write voltage Vwr_MRAM is applied to the selected bit line and the reference voltage (e.g., 0V) is applied to the selected source line to write bit data of "1" to the magneto-resistive storage element 203. A write voltage of -Vwr_MRAM is applied to the selected bit line and the reference voltage (e.g., 0V) is applied to the selected source line to write the bit data of "0" to the magneto-resistive storage element 203. As the voltage difference between the selected bit line and the selected source line, a current flow through the magneto-resistive storage element 203. The current flowing though the magneto-resistive storage element 203 writes the second bit data of the multi-bit data to the magneto-resistive storage element 203 of the selected multi-level memory cell. In some embodiments, a voltage difference between the voltages Vwr_MRAM and Von_FE are not enough to disturb the data stored in the ferroelectric storage element 201 of the selected multi-level memory cell.

In some embodiments, the unselected word lines, unselected bit line and the unselected source line are all biased by the reference voltage (e.g., 0V) during a writing period of the magneto-resistive storage element 203 of the selected multi-level memory cell. As such, no current is following through the magneto-resistive storage element 203 of the unselected multi-level memory cells.

Referring to FIG. 3A and FIG. 3B, when the bit data stored in the ferroelectric storage element 201 is "0" (IV curves 303 and 304), the current difference between the currents I3 and I4 are relatively small. In other words, the read margin for reading the bit data stored in the magneto-resistive storage element 203 is relatively small. By contrast, when the bit data stored in the ferroelectric storage element 201 is "1" (IV curves 301 and 302), the read margin for reading the bit data of the magneto-resistive storage element 203 is relatively large. In some embodiments, when it determines that the bit data stored in the ferroelectric storage element 201 is "0" (or the ferroelectric storage element 201 has the high threshold voltage), the memory device (e.g., memory device 100) is configured to perform a write operation to change the bit data stored in the ferroelectric storage element 201 from "0" to "1". The arrow AR in FIG. 3B illustrating the write operation to change the logic state of the ferroelectric storage element 201 from "0" to "1". Next, the memory device 100 performs a read operation to read the bit data stored in the magneto-resistive storage element 203. In this way, the read margin for reading the magneto-resistive storage element 203 is improved.

Referring to FIG. 3C, a read current Iread may be applied to a selected multi-level memory cell, and a voltage is measured from the selected multi-level memory cell to determine the logic state stored in the selected multi-level memory cell. As shown in FIG. 3C, when the read current Iread is applied to the selected multi-level memory cell, a voltage V1 is sensed when the stored logic state of the selected multi-level memory cell is "11". Similarly, voltages V2, V3 and V4 are sensed when the stored logic state of the selected multi-level memory cell is "10", "01" and "00", respectively. As such, the stored logic state of the selected multi-level memory cell may be determined by applying the read current Iread and sensing the voltage from the selected multi-level memory cell. In some embodiments, the sensing voltage from the multi-level memory cell may be compare with at least one threshold value to determine the logic state stored in the multi-level memory cells.

Figure 4:
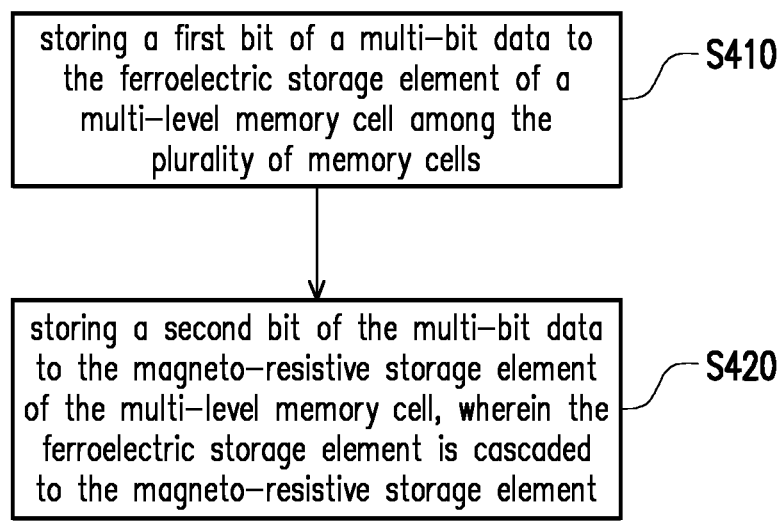
FIG. 4 is a flowchart diagram illustrating a method adapted to a memory device in accordance with some embodiment.

FIG. 4 illustrates a method adapted to a memory device that has a plurality of multi-level memory cells. In step S410, a first bit of a multi-bit data is stored to a ferroelectric storage element of a multi-level memory cell among the plurality of memory cells. In step S420, a second bit of the multi-bit data to a magneto-resistive storage element of the multi-level memory cell, wherein the ferroelectric storage element is cascaded to the magneto-resistive storage element.

In accordance with some embodiments, a ferroelectric storage element may be cascaded with a magneto-resistive storage element to form a multi-level memory cell. The ferroelectric storage element may store two logic states based on a threshold voltage of the ferroelectric storage element, and the magneto-resistive storage element may store two logic states based on an electrical resistance of the ferroelectric storage element. As such, the integration of the ferroelectric storage element and the magneto-resistive storage element may store a multi-bit data, thereby achieving high storage density. In addition, the ferroelectric storage element and the magneto-resistive storage element may have substantially same footprint area on a semiconductor die or a semiconductor circuit. As such, the integration of the ferroelectric storage element and the magneto-resistive storage element may increase the logic states stored in the memory cell without area penalty. Furthermore, the ferroelectric storage element may be formed in a FEOL processing of a semiconductor fabrication and the magneto-resistive storage element may be formed in a BEOL processing of the semiconductor fabrication. In this way, a processing flow for integrating the ferroelectric storage element and the magneto-resistive storage element is simplified with low manufacturing cost.

In accordance with some embodiments, a memory device that includes a plurality of word lines, a plurality of bit lines, a plurality of source lines and a plurality of memory cells is introduced. Each of the plurality of memory cells is coupled to one of the plurality of word lines, one of the plurality of bit lines and one of the plurality of source lines. Each of the plurality of memory cells includes a ferroelectric storage element and a magneto-resistive storage element, in which the ferroelectric storage element is configured to store a first bit of a multi-bit data and the magneto-resistive storage element is configured to store a second bit of the multi-bit data. The ferroelectric storage element is cascaded to the magneto-resistive storage element.

In accordance with some embodiments, a multi-level memory cell that includes a ferroelectric memory element and a magneto-resistive storage element is introduced. The ferroelectric memory element is configured to store a first bit of a multi-bit data, and the magneto-resistive storage element is configured to store a second bit of the multi-bit data. The ferroelectric storage element is cascaded to the magneto-resistive storage element.

In accordance with some embodiments, a method that is adapted to a memory device having a plurality of multi-level memory cells is introduced. Each of the plurality of multi-level memory cells includes a ferroelectric storage element and a magneto-resistive storage element cascaded to the ferroelectric storage element. The method includes steps of storing a first bit of a multi-bit data to the ferroelectric storage element of a multi-level memory cell among the plurality of multi-level memory cells; and storing a second bit of the multi-bit data to the magneto-resistive storage element of the multi-level memory cell. The ferroelectric storage element is cascaded to the magneto-resistive storage element.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure

What is claimed is:

1. A memory device, comprising:
a plurality of word lines, a plurality of bit lines and a plurality of source lines; and
a plurality of multi-level memory cells, each of the plurality of multi-level memory cells is coupled to one of the plurality of word lines, one of the plurality of bit lines and one of the plurality of source lines, wherein each of the plurality of multi-level memory cells comprises:
a ferroelectric storage element, configured to store a first bit of a multi-bit data; and
a magneto-resistive storage element, configured to store a second bit of the multi-bit data,
wherein ferroelectric storage element is cascaded to the magneto-resistive storage element,
the ferroelectric storage element is formed in a front-end-of-line processing of a semiconductor fabrication, and
the magneto-resistive storage element is formed in a back-end-of-line processing of the semiconductor fabrication.

2. The memory device of claim 1, wherein
a footprint area of the ferroelectric storage element is same as a footprint area of the magneto-resistive storage element.

3. The memory device of claim 1, wherein the ferroelectric storage element comprises:
a substrate, comprising a first doped region and a second doped region;
a drain terminal, coupled to the first doped region of the substrate;
a source terminal, coupled to the second doped region of the substrate;
a gate terminal; and
a ferroelectric layer, located between the gate terminal and a region that is located between the first doped region and the second doped region of the substrate.

4. The memory device of claim 1, wherein the magneto-resistive storage element comprises:
a magnetic layer, having a variable polarization direction;
a reference magnetic layer, having a fixed polarization direction; and
a tunnel barrier layer, sandwiched between the magnetic layer and the reference magnetic layer, wherein an electrical resistance of the magneto-resistive storage element varies according to whether the variable polarization direction of the magnetic layer is aligned with the fixed polarization direction of the reference magnetic layer.

5. The memory device of claim 1, further comprising:
a read/write circuit, coupled to the plurality of multi-level memory cells, configured to perform a memory operation to a selected multi-level memory cell among the plurality of multi-level memory cells,
the selected multi-level memory cell is coupled to a selected word line from the plurality of word lines, a selected bit line from the plurality of bit lines and a selected source line from the plurality of source lines.

6. The memory device of claim 5, wherein the read/write circuit is configured to:
   read the first bit stored in the ferroelectric storage element; and
   in response to determining that the first bit stored in the ferroelectric storage element is a first logic state, perform a write operation to change the first bit stored in the ferroelectric storage element from the first logic state to a second logic state and read the second bit stored in the magneto-resistive storage element.

7. The memory device of claim 5, wherein the read/write circuit is configured to:
   write first bit data to the ferroelectric storage element based on a voltage difference between the selected word line and the selected bit line; and
   write second bit data to the magneto-resistive storage element based on a current flowing through the selected bit line and the selected source line.

8. The memory device of claim 7, wherein the read/write circuit is configured to:
   apply a first write voltage to the selected word line and apply a reference voltage to the selected bit line and the selected source line to write the first bit data to the ferroelectric storage element, and
   apply an enable voltage to the selected word line, apply the reference voltage to the selected source line, and apply a second write voltage to the selected bit line to write the second bit data to the magneto-resistive storage element.

9. The memory device of claim 8, wherein
   the read/write circuit is configured to write the first bit data to the ferroelectric storage element before writing the second bit data to the magneto-resistive storage element.

10. A multi-level memory cell, comprising:
    a ferroelectric memory element, configured to store a first bit of a multi-bit data;
    a magneto-resistive storage element, configured to store a second bit of the multi-bit data,
    wherein the ferroelectric storage element is cascaded to the magneto-resistive storage element,
    the ferroelectric storage element is formed in a front-end-of-line processing of a semiconductor fabrication, and
    the magneto-resistive storage element is formed in a back-end-of-line processing of the semiconductor fabrication.

11. The multi-level memory cell of claim 10, wherein
    a footprint area of the ferroelectric storage element is same as a footprint area of the magneto-resistive storage element.

12. The multi-level memory cell of claim 11, wherein the ferroelectric storage element comprises:
    a substrate, comprising a first doped region and a second doped region;
    a drain terminal, coupled to the first doped region of the substrate;
    a source terminal, coupled to the second doped region of the substrate;
    a gate terminal; and
    a ferroelectric layer, located between the gate terminal and a region between the first doped region and the second doped region of the substrate.

13. The multi-level memory cell of claim 11, wherein the magneto-resistive storage element comprises:
    a magnetic layer, having a variable polarization direction;
    a reference magnetic layer, having a fixed polarization direction; and
    a tunnel barrier layer, sandwiched between the magnetic layer and the reference magnetic layer, wherein an electrical resistance of the magneto-resistive storage element varies according to whether the variable polarization direction of the magnetic layer is aligned with the fixed polarization direction of the reference magnetic layer.

14. The multi-level memory cell of claim 10, further comprising:
    an access transistor, configured to enable the multi-level memory cell for a memory operation.

15. The multi-level memory cell of claim 10, wherein
    first bit data is written to the ferroelectric storage element based on a voltage difference between a word line and a bit line, and
    second bit data is written to the magneto-resistive storage element based on a current flowing through the bit line and a source line.

16. A method, adapted to a memory device having a plurality of multi-level memory cells, each of the plurality of multi-level memory cells comprises a ferroelectric storage element and a magneto-resistive storage element, the method comprising:
    storing a first bit of a multi-bit data to the ferroelectric storage element of a multi-level memory cell among the plurality of multi-level memory cells; and
    storing second bit of the multi-bit data to the magneto-resistive storage element of the multi-level memory cell among the plurality of multi-level memory cells,
    wherein the ferroelectric storage element is cascaded to the magneto-resistive storage element,
    wherein the ferroelectric storage element is formed in a front-end-of-line processing of a semiconductor fabrication, the magneto-resistive storage element is formed in a back-end-of-line processing of the semiconductor fabrication.

17. The method of claim 16, further comprising:
    reading the first bit stored in the ferroelectric storage element;
    in response to determining that the first bit stored in the ferroelectric storage element is a first logic state, performing a write operation to change the first bit stored in the ferroelectric storage element from the first logic state to a second logic state and reading the second bit stored in the magneto-resistive storage element.

18. The method of claim 16, further comprising:
    writing first bit data to the ferroelectric storage element based on a voltage difference between a word line and a bit line coupled to the multi-level memory cell; and
    writing second bit data to the magneto-resistive storage element based on a current flowing through the bit line and a source line coupled to the multi-level memory cell,
    wherein writing the first bit data to the ferroelectric storage element comprises:
      applying a first write voltage to the word line; and
      applying a reference voltage to the bit line and the source line, and
    wherein writing the second bit data to the magneto-resistive storage element comprises:
      applying an enable voltage to the word line;
      applying the reference voltage to the source line; and
      applying a second write voltage to the bit line.

* * * * *